United States Patent

Sawada

[11] Patent Number: 6,078,317
[45] Date of Patent: *Jun. 20, 2000

[54] DISPLAY DEVICE, AND DISPLAY CONTROL METHOD AND APPARATUS THEREFOR

[75] Inventor: Masayuki Sawada, Yokohama, Japan

[73] Assignee: Canon Kabushiki Kaisha, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/540,226

[22] Filed: Oct. 6, 1995

[30] Foreign Application Priority Data

Oct. 12, 1994 [JP] Japan .................................. 6-246465

[51] Int. Cl.[7] .................................................. G09G 5/00
[52] U.S. Cl. ................................... 345/204; 345/132
[58] Field of Search .................................... 345/204, 127, 345/131, 132, 89

[56] References Cited

U.S. PATENT DOCUMENTS

| | | | |
|---|---|---|---|
| 5,047,759 | 9/1991 | Takebe et al. ........................... | 340/789 |
| 5,185,817 | 2/1993 | Degi et al. .............................. | 345/132 |
| 5,216,417 | 6/1993 | Honda ....................................... | 345/89 |
| 5,231,389 | 7/1993 | Yamauchi ................................ | 340/814 |
| 5,261,082 | 11/1993 | Ito et al. .................................. | 395/550 |
| 5,389,898 | 2/1995 | Taketoshi et al. ........................ | 331/2 |
| 5,406,308 | 4/1995 | Shiki ...................................... | 345/127 |
| 5,481,275 | 1/1996 | Mical et al. ............................ | 345/132 |
| 5,521,614 | 5/1996 | Kotha et al. ........................... | 345/131 |
| 5,598,184 | 1/1997 | Barkans .................................. | 345/149 |

FOREIGN PATENT DOCUMENTS

| | | |
|---|---|---|
| 0 400 286 | 12/1990 | European Pat. Off. . |
| 0 479 508 | 4/1992 | European Pat. Off. . |
| 0 519 744 | 12/1992 | European Pat. Off. . |
| 6-104748 | 4/1994 | Japan . |

OTHER PUBLICATIONS

J.P. Lacoste, et al., "Aspect Ratio Management in CCD Cameras", 18th International Television Symposium and Technical Exhibition, pp. 52–62 (Jun. 10–15, 1993).

S. Ohi, et al., "A 13–in.–Diagonal Full–Color High–Resolution TFT–LCD with a New Analog Signal Conversion Scheme", SID 93 Digest, pp. 7–10, (May 16, 1993).

*Primary Examiner*—Amare Mengistu
*Attorney, Agent, or Firm*—Fitzpatrick, Cella, Harper & Scinto

[57] ABSTRACT

A display control apparatus for displaying an image by receiving an RGB video signal including an image signal and a synchronizing signal receives horizontal and vertical synchronizing signals in the RGB video signal, and detects the current display mode using a display mode detector. A pixel synchronizing clock signal is generated using a clock generator in correspondence with the detected display mode, and the RGB video signal is interpolated by an interpolation processing circuit in correspondence with the display mode and the display screen size of an FLCD panel. The interpolated video signal is subjected to image signal processing, and the processed video signal is displayed on the FLCD panel.

20 Claims, 5 Drawing Sheets

| INPUT SIGNAL (NUMBER OF PIXELS) | VERTICAL FREQUENCY | HORIZONTAL FREQUENCY | FREQUENCY OF PIXEL CLOCK | NUMBER OF DISPLAY PIXELS ON FLCD 24 | VERTICAL ENLARGEMENT METHOD | FREQUENCY OF DOT CLOCK SIGNAL |
|---|---|---|---|---|---|---|
| VGA (640 × 480) | 60Hz | 31.5KHz | 25MHz | 1280 × 960 | ×2 INTERPOLATION | 50MHz |
| SVGA (800 × 600) | 60Hz | 37.8KHz | 40MHz | 1280 × 960 | ×1.6 INTERPOLATION | 64MHz |
| SVGA (1024 × 768) | 60Hz | 48.3KHz | 65MHz | 1280 × 960 | ×1.25 INTERPOLATION | 81.3MHz |

FIG. 5

DISPLAY DEVICE, AND DISPLAY CONTROL METHOD AND APPARATUS THEREFOR

BACKGROUND OF THE INVENTION

The present invention relates to a display device for displaying an image on a screen, and a display control method and apparatus therefor.

In recent years, personal computers have been widely used not only in processing of scientific and technical data, but also in applications requiring a graphic display such as CAD, design, and the like. Accordingly, it has been required to improve the image quality and definition in the graphic display of a computer display. In order to meet such requirements, the following methods are available:

(1) to increase the display resolution; and
(2) to increase the frame (field) frequency. By the former method (1), a high-definition image can be obtained, and by the latter method (2), an image display free from flickering is attained.

Furthermore, recent personal computers normally use displays capable of a display operation in an SVGA (Super Video Graphic Array) mode at a high resolution of 800×600, 1,024×768, or 1,280×1,024 in addition to a VGA (Video Graphic Array) mode at a resolution of 640×480, which was the standard mode before the advent of the SVGA mode. In addition, the frequency of a vertical synchronizing signal used in the display is increasing from 60 Hz to more than 70 Hz. In this manner, the display performance of a personal computer is improving to a level as high as that of a workstation.

On the other hand, as a display device, a flat panel display using, e.g., a liquid crystal has recently received a lot of attention. It is expected that such a flat panel display be used as a display monitor not only for lap-top computers and notebook computers but also for desktop computers due to its compact structure and very low radiation of electromagnetic waves in place of the CRT displays used so far.

As one of the flat panel displays, a display using a ferroelectric liquid crystal (FLC) (to be abbreviated as an FLCD hereinafter) is commercially available. Such an FLCD has a memory characteristic (i.e., a it maintains the ON/OFF states of liquid crystal pixels after an electric field required for turning on/off the pixels to be displayed is removed), and by utilizing this characteristic, a large-screen of flat panel display, which is very difficult to attain by conventional liquid crystal technology, can be realized. More specifically, by using a partial rewrite scanning mode for selectively scanning only lines of changed image data to be displayed, the screen can be efficiently refreshed. With this technique, even when the frequency for rewriting the entire frame (to be simply referred to as a frame frequency hereinafter for the sake of simplicity) decreases due to an increase in number of display lines upon construction of a large-screen/high-definition display, a sufficient response speed can be assured as the screen of the computer display.

With existing FLCD techniques, since each pixel to be displayed is set in either the ON or OFF state, a binary display is basically performed. For this reason, in order to obtain a larger number of display colors, one or a plurality of methods below must be independently-used or combined.

(1) Each pixel is divided into sub-pixels, and area gradation is attained by combining the sub-pixels.

(2) Digital halftone processing such as the "dither method", the "error diffusion method", or the like is performed to attain pseudo halftone expression.

Furthermore, in the case of a display which changes the display state in real time, high-speed processing is required in the sub-pixel driving operation or the digital halftone processing.

When a video signal supplied from a computer is displayed on the screen of an FLCD of high-definition, the display operation is realized as follows. That is, when the number of display pixels of the FLCD is equal to the number of pixels output from the computer, i.e., is 1,280×1,024, an image and synchronizing signal are received from the computer, and horizontal and vertical synchronizing signals are separated from the synchronizing signal. Using the separated horizontal synchronizing signal, a FLCD dot clock signal synchronized with the pixel clocks of the computer is reproduced, and the image signal is A/D (analog-to-digital) converted using the FLCD dot clock signal. The converted digital data is subjected to $\gamma$ characteristic adjustment and halftone processing. Thereafter, the digital image data is transferred to an output controller of the FLCD, thus displaying an image. In this case, the timings of the horizontal and vertical synchronizing signals and the dot clock signal synchronized with displaying pixels are peculiar to each computer. For this reason, using an FLCD interface board depending on the computer to be connected, image data from the computer can be displayed on the FLCD.

However, when an image signal from the computer is displayed on the FLCD by the above-mentioned method, the following problems are posed.

(1) Since there are some display modes such as VGA, SVGA, and the like, the FLCD dot clock signal used for A/D-converting image data must be reproduced in correspondence with each display mode. For this purpose, a plurality of display control circuits depending on the respective display modes are required, and disadvantages associated with cost and limitations in use are imposed on a user.

(2) When display operations in the respective display modes are performed on the FLCD as a bit-map display, if the VGA mode is selected, the number of pixels of a video signal in the VGA mode is 640×480, and hence, an image is displayed on only a portion about ¼ of the 1,280×1,024 FLCD display. More specifically, the features of the large-screen, high-definition FLCD cannot be fully utilized.

SUMMARY OF THE INVENTION

The present invention has been made in consideration of the above situation, and has as its object to provide a display device which can display an image in correspondence with various display modes, and a display control method and apparatus therefor.

It is another object of the present invention to provide a display device which can display an image by effectively utilizing the display screen, and a display control method and apparatus therefor.

It is still another object of the present invention to provide a display device which can perform display control corresponding to various display modes using one display interface circuit, and a display control method and apparatus therefor.

It is still another object of the present invention to provide a display device which can display an input video signal in an enlarged scale in correspondence with the display mode and size of the input video signal, and the size of the display screen, and a display control method and apparatus therefor.

It is still another object of the present invention to provide a display device which can adjust the display position of an image on the display screen, and a display control method and apparatus therefor.

It is still another object of the present invention to provide a display device which can display an image in both the VGA and SVGA modes, and a display control method and apparatus therefor.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principle of the invention.

DESCRIPTION OF THE PREFERRED EMBODIMENTS

The preferred embodiments of the present invention will be described in detail hereinafter with reference to the accompanying drawings.

Figure 1:
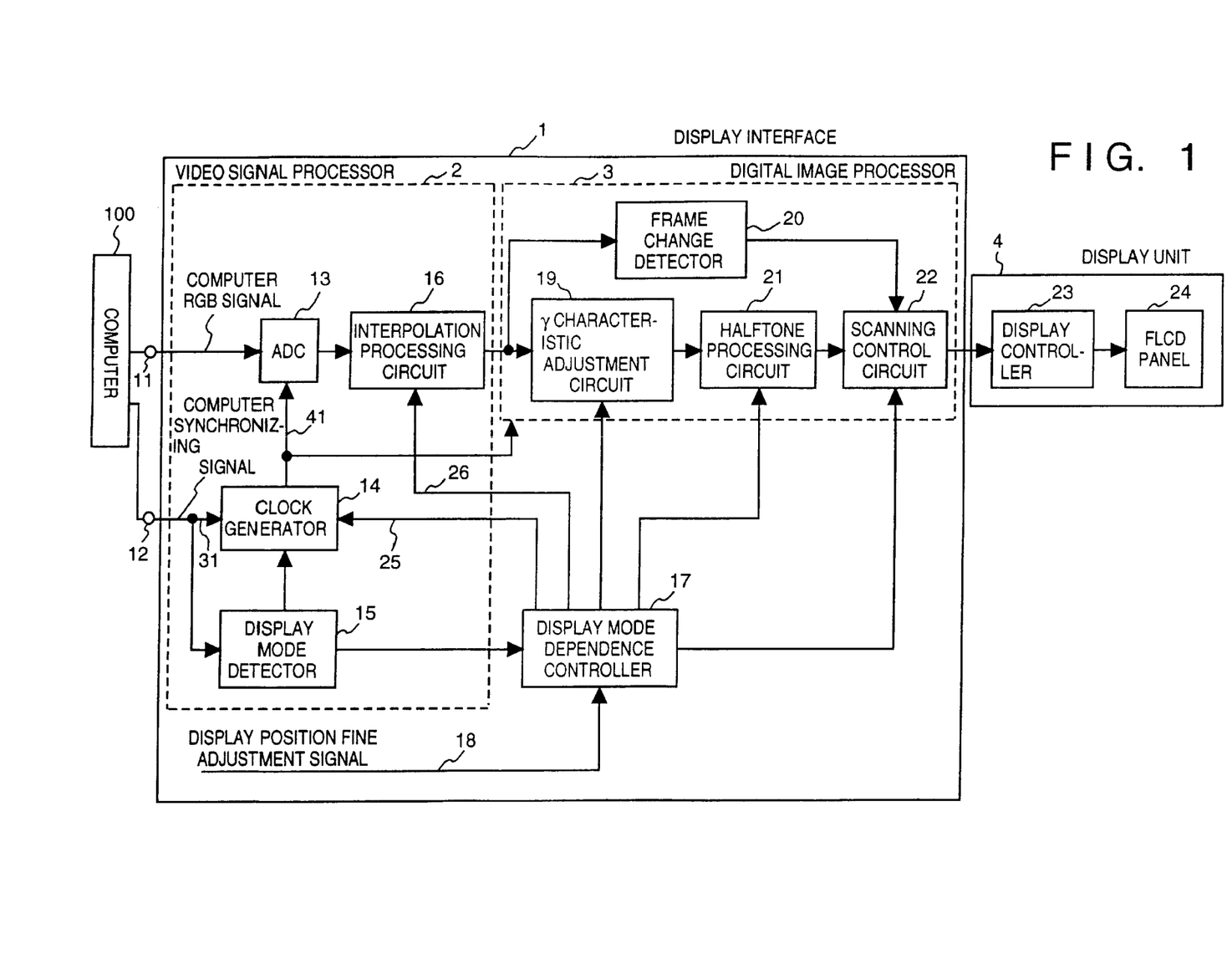
FIG. 1 is a block diagram showing the arrangement of a display control apparatus according to an embodiment of the present invention.

FIG. 1 is a block diagram showing the arrangement of a display control apparatus according to an embodiment of the present invention.

Referring to FIG. 1, reference numeral 1 denotes a display interface; 2 denotes a video signal processor; 3 denotes a digital image processor; and 4 denotes an FLC display unit. Reference numeral 11 denotes an input terminal for receiving an RGB signal from, e.g., a computer 100 such as a workstation, a personal computer, or the like; 12 denotes a terminal for receiving an image synchronizing signal from, e.g., the computer 100 as in the input terminal 11. The video and synchronizing signals output from the computer 100 are input to and processed by the display interface 1, and thereafter, an image is displayed on the display unit 4.

A display mode detector 15 receives vertical and horizontal synchronizing signals in the computer synchronizing signal input from the terminal 12, and discriminates the current display mode on the basis of the timings, polarities, and the like of these synchronizing signals. The display mode detector 15 supplies the detection result to a display mode dependence controller 17. A clock generator 14 receives a horizontal synchronizing signal in the synchronizing signal supplied from the computer 100, and generates a dot clock signal 41 in accordance with the discrimination result of the display mode supplied from the display mode dependence controller 17.

An ADC (A/D converter) 13 samples an RGB analog signal input from the input terminal 11 at the timing of the dot clock signal 41 supplied from the clock generator 14 to generate a quantized digital RGB image data including 1,280 pixels per line. An interpolation processing circuit 16 expands the image defined by the input digital RGB image data input from the ADC 13 in the vertical direction in correspondence with the display mode. The interpolation processing circuit 16 comprises a line buffer or a frame buffer, and obtains an average of two adjacent pixels as a pixel value therebetween by a linear interpolation method. However, the interpolation processing circuit 16 may adopt other interpolation methods in consideration of the cost/performance ratio. Whether or not interpolation of an image in the vertical direction is performed is designated by the display mode dependence controller 17.

In consideration of the nonlinear input/luminance characteristics ($\gamma$ characteristics) of a specific or typical CRT, an RGB video signal input from the input terminal 11 normally includes characteristics for canceling the characteristics. A $\gamma$ characteristic adjustment circuit 19 adjusts the characteristics included in the RGB image data in correspondence with those of an FLCD panel 24 of the display unit 4, so as to obtain an appropriate luminance on the FLCD panel 24. The $\gamma$ characteristic adjustment circuit 19 comprises an LUT (look-up table) using a high-speed SRAM, and is set by the display mode dependence controller 17. A halftone processing circuit 21 performs halftone processing (e.g., dither processing) for the image data supplied from the $\gamma$ characteristic adjustment circuit 19.

A frame change detector 20 compares digital image data supplied from the interpolation processing circuit 16 in units of frames, so as to detect changed lines of the image data between frames, and supplies the detection result to a scanning control circuit 22. The scanning control circuit 22 instructs the display unit 4 to display image data subjected to the halftone processing in the halftone processing circuit 21 on the screen (1,280×1,024) of the FLCD panel 24. More specifically, the circuit 22 outputs the line number of a line to be displayed, and then, transfers image data for the line. Thereafter, upon reception of the end message of displaying of the line, the circuit 22 transfers the line number of the next line to be displayed and image data for the line. Furthermore, the circuit 22 generates a signal for instructing the performance of a two-line simultaneous driving operation, as needed. The scanning control circuit 22 changes the scanning method as follows in accordance with an instruction from the display mode dependence controller 17 in correspondence with the display mode.

More specifically, in the VGA mode, the circuit 22 preferentially scans a changed line detected by the frame change detector 20 on the basis of interlace scanning while performing the two-line simultaneous driving operation. On the other hand, in the SVGA mode with the number of pixels (e.g., 800×600 or 1,204×768) smaller than the number of displayable pixels (1,280×1,024) of the FLCD panel 24, the circuit 22 performs a normal one-line driving operation on the basis of an interlace scanning, and preferentially scans a changed line detected by the frame change detector 20 in image data subjected to the interpolation processing. The above-mentioned VGA or SVGA mode is controlled to display an image at substantially the center of the FLCD panel 24 since the number of pixels displayed on the FLCD panel 24 is 1,280×960. A display controller 23 displays the image data of a line designated by the scanning control circuit 22 on the FLCD panel 24.

Figure 2:
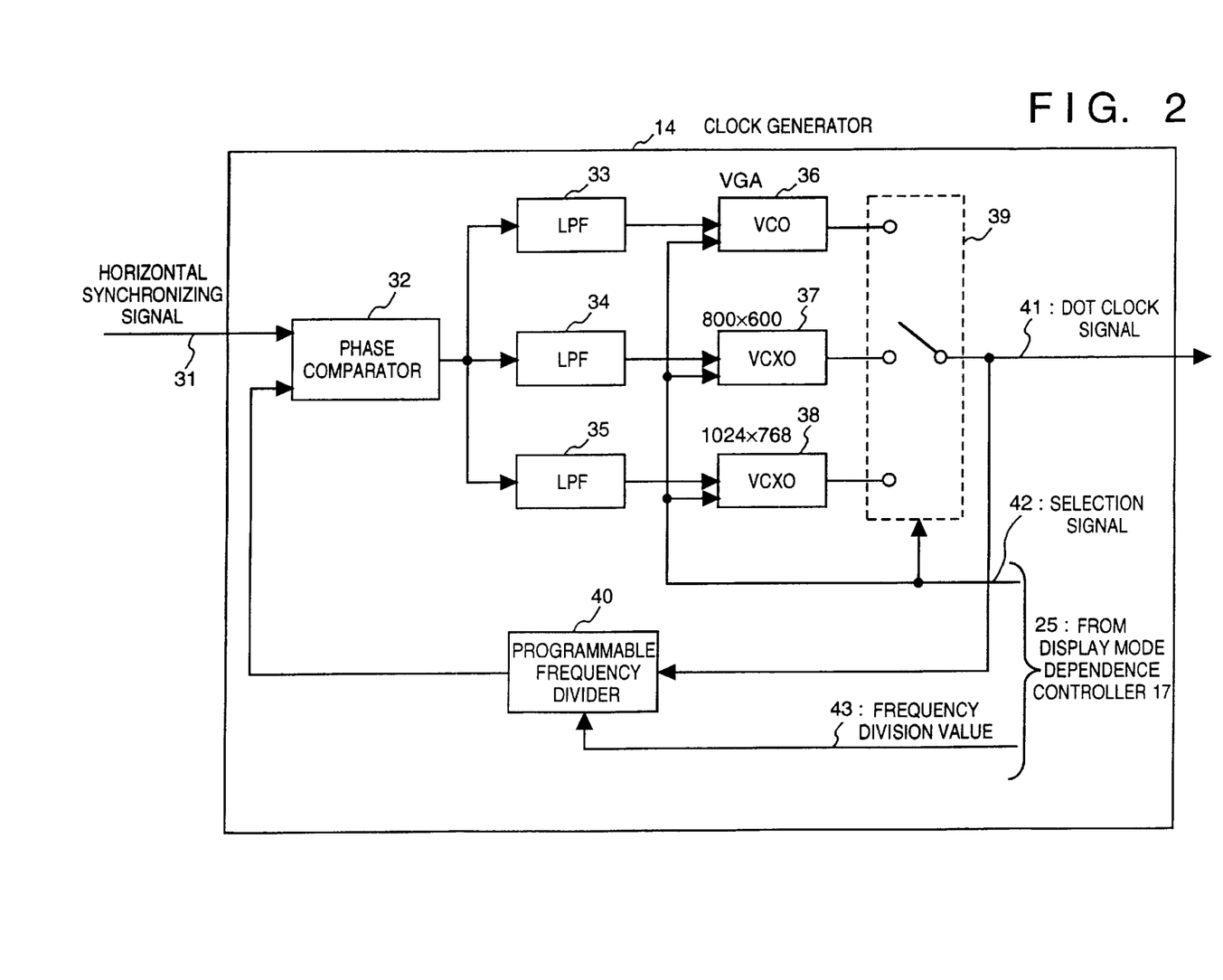
FIG. 2 is a block diagram showing the arrangement of a clock generator of the embodiment shown in FIG. 1.

FIG. 2 is a block diagram showing the arrangement of the clock generator 14 of this embodiment.

Reference numeral 32 denotes a phase comparator which detects the phase difference between a horizontal synchronizing signal 31 input from the computer 100 and a signal supplied from a programmable frequency divider 40. A VCO (Voltage Controlled Oscillator) 36 and VCXOs 37 and 38 are oscillators for generating dot clock signal 41 in correspondence with each display mode. LPFs 33 to 35 are low-pass filters having a high-input impedance, each of which filters a frequency signal in corresponding to each of the horizontal frequencies of the respective display modes. Reference numeral 39 denotes a selection switch which comprises a circuit that allows a high-speed operation, such as a low-impedance analog switch, an ECL, or the like. The switch 39 selects one of the outputs from the VCOs (36 to 38) in response to a selection signal 42 supplied from the display mode dependence controller 17, and outputs the selected outputs as the dot clock signal 41.

Figure 3:
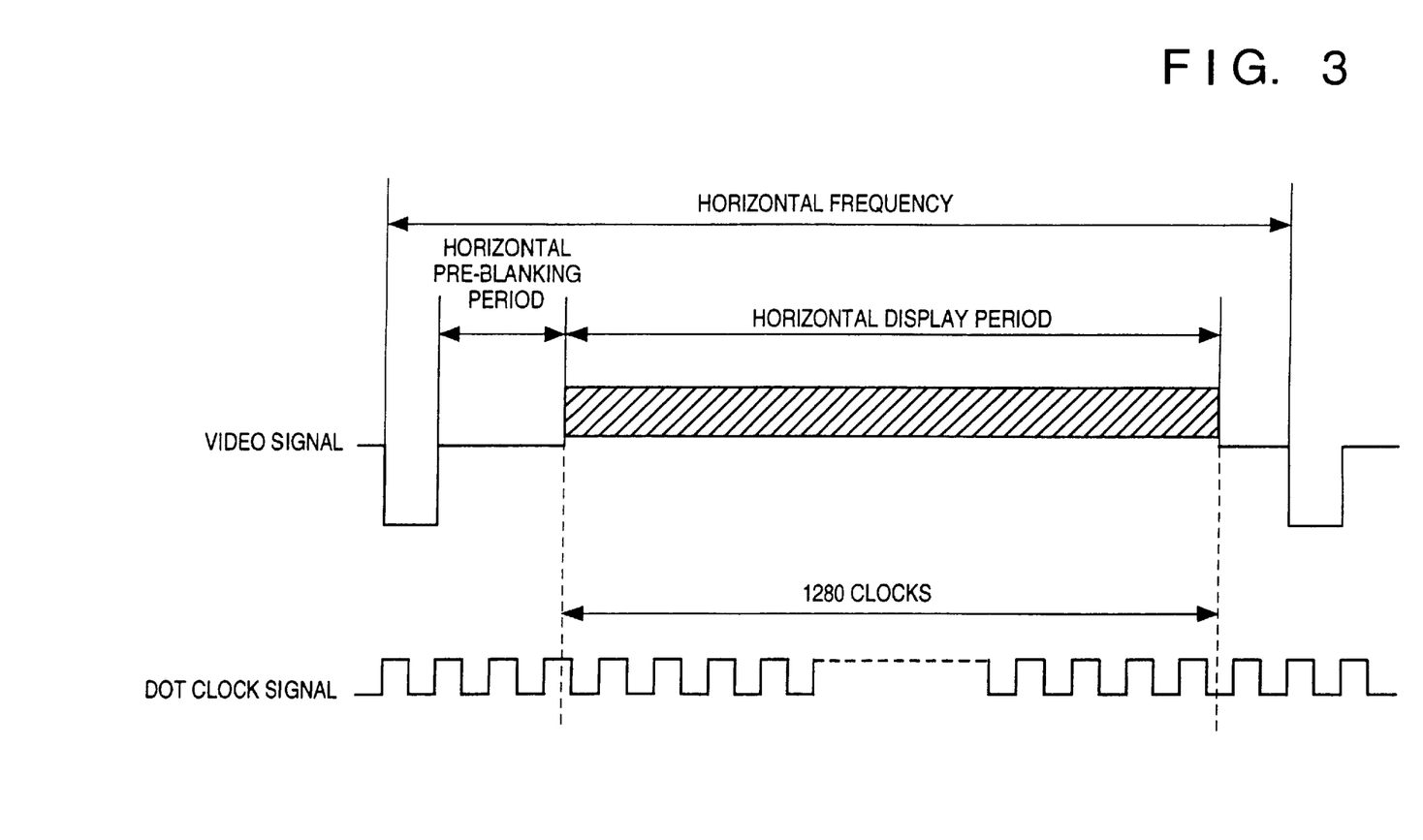
FIG. 3 is a timing chart showing an example of the timings of a video signal supplied from a computer and a dot clock signal in the embodiment shown in FIG. 1.

FIG. 3 is a timing chart showing the relationship between the video signal and the dot clock signal 41.

A frequency division value 43 of the programmable frequency divider 40 is determined and set by the display mode dependence controller 17 so as to generate 1,280 clocks corresponding to the horizontal resolution of the FLCD panel 24 during the horizontal display period, as shown in FIG. 3.

Note that the display mode dependence controller 17 supplies control signals to the video signal processor 2 and the digital-image processor 3 in accordance with the discrimination result of the display mode detector 15, as described above.

Examples of the video input signal timings corresponding to the respective display modes and the method of controlling the clock generator 14, the interpolation processing circuit 16, and the scanning control circuit 22 in the respective modes will be explained below with reference to FIGS. 1 to 4.

Figure 4:
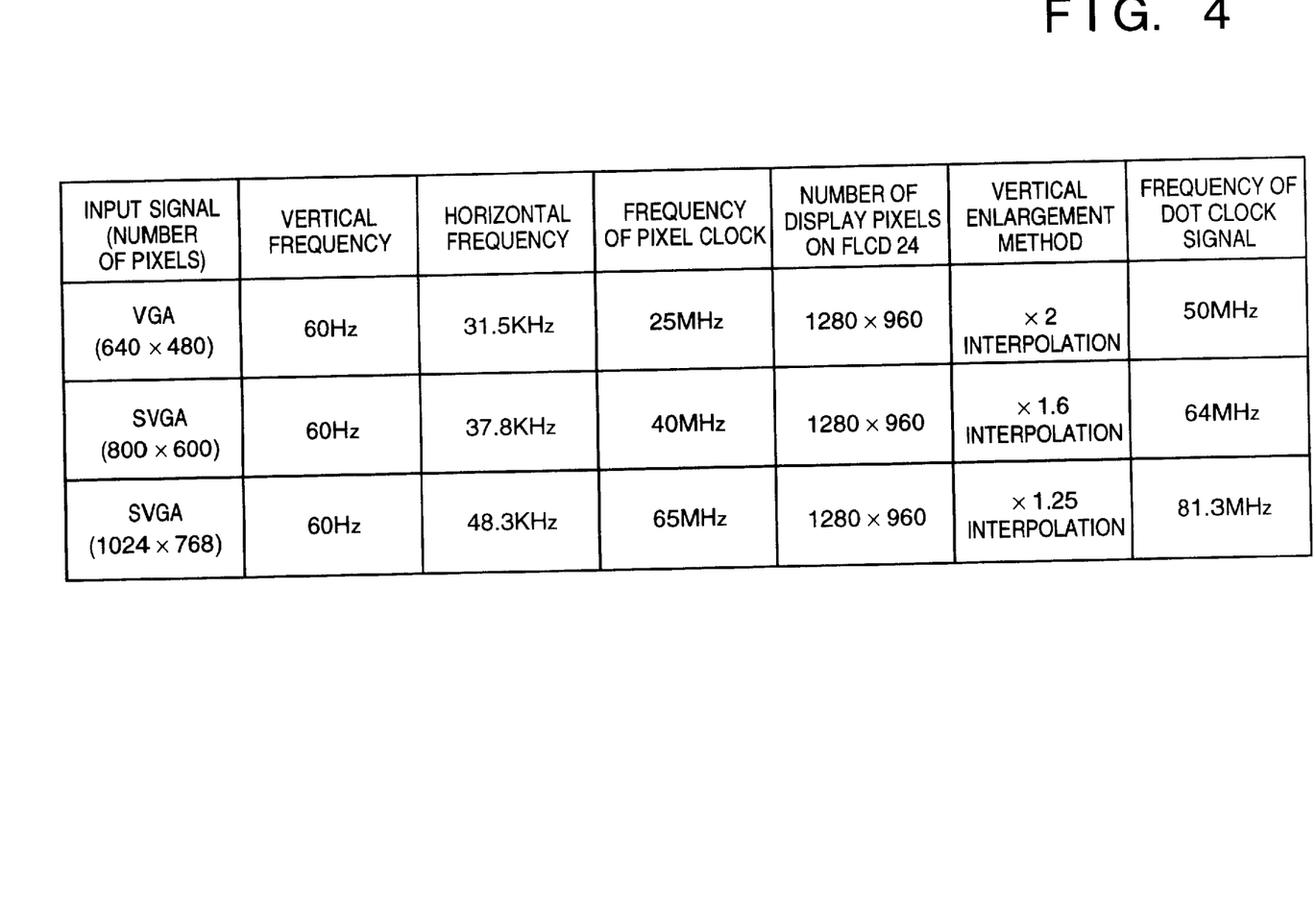
FIG. 4 is a table for explaining the operation conditions of modules of digital image processing in respective display modes in the display control apparatus of the embodiment shown in FIG. 1.

For example, as shown in FIG. 4, when a signal is input in the VGA mode with the number of pixels=640×480, the display mode dependence controller 17 outputs the selection signal 42 for selecting the LPF 33 and the VCO 36, so as to sample the horizontal display period using 1,280 clocks. In this case, the frequency of the dot clock signal 41 is 50 MHz. Since the number of pixels capable of being displayed (1280) in the horizontal direction of the FLCD panel 24 is twice the number of input pixels, the number of pixels to be displayed in the vertical direction is similarly doubled to maintain the aspect ratio. In this case, a control signal for performing the two-line simultaneous driving operation is supplied to the scanning control circuit 22.

On the other hand, when a signal is input in the SVGA mode with the number of pixels=1,024×768, the display mode dependence controller 17 outputs the selection signal 42 for selecting the LPF 35 and the VCXO 38. In this case, the frequency of the dot clock signal 41 is 81.3 MHz (as shown in FIG. 4). Since the number of display pixels in the horizontal direction of the FLCD panel 24 is 1.25 times the number of input pixels, the number of pixels to be displayed in the vertical direction is also multiplied by 1.25 to maintain the aspect ratio, as in the VGA mode. In this case, image data is enlarged in the vertical direction by the interpolation processing circuit 16. For this purpose, the display mode dependence controller 17 supplies a vertical interpolation control signal 26 corresponding to the current mode to the interpolation processing circuit 16.

Furthermore, since the timings of the image synchronizing signals or the frequencies of vertical and horizontal synchronizing signals, the dot clock signal, and the like often differ even in a display mode, the display position of an image displayed on the FLCD panel 24 is often displaced from the central portion of the FLCD panel 24. For this reason, the display mode dependence controller 17 supplies control signals to the video signal processor 2 and the digital image processor 3 in response to a display position fine adjustment signal 18 input by a user. For example, since the horizontal displaying period differs if the frequency of the pixel clock signal varies, the width of an image is enlarged or reduced. In order to correct this, the frequency of the dot clock signal 41 must be changed, and the frequency division value 43 of the programmable frequency divider 40 is changed in correspondence with the user's fine adjustment (signal 18). On the other hand, when the horizontal pre-blanking period differs, the start position of displaying in a horizontal direction varies. In order to correct this, the display mode dependence controller 17 supplies a control signal for changing the timing of transfer of image data to the scanning control circuit 22 in response to the user's fine adjustment signal 18.

Figure 5:
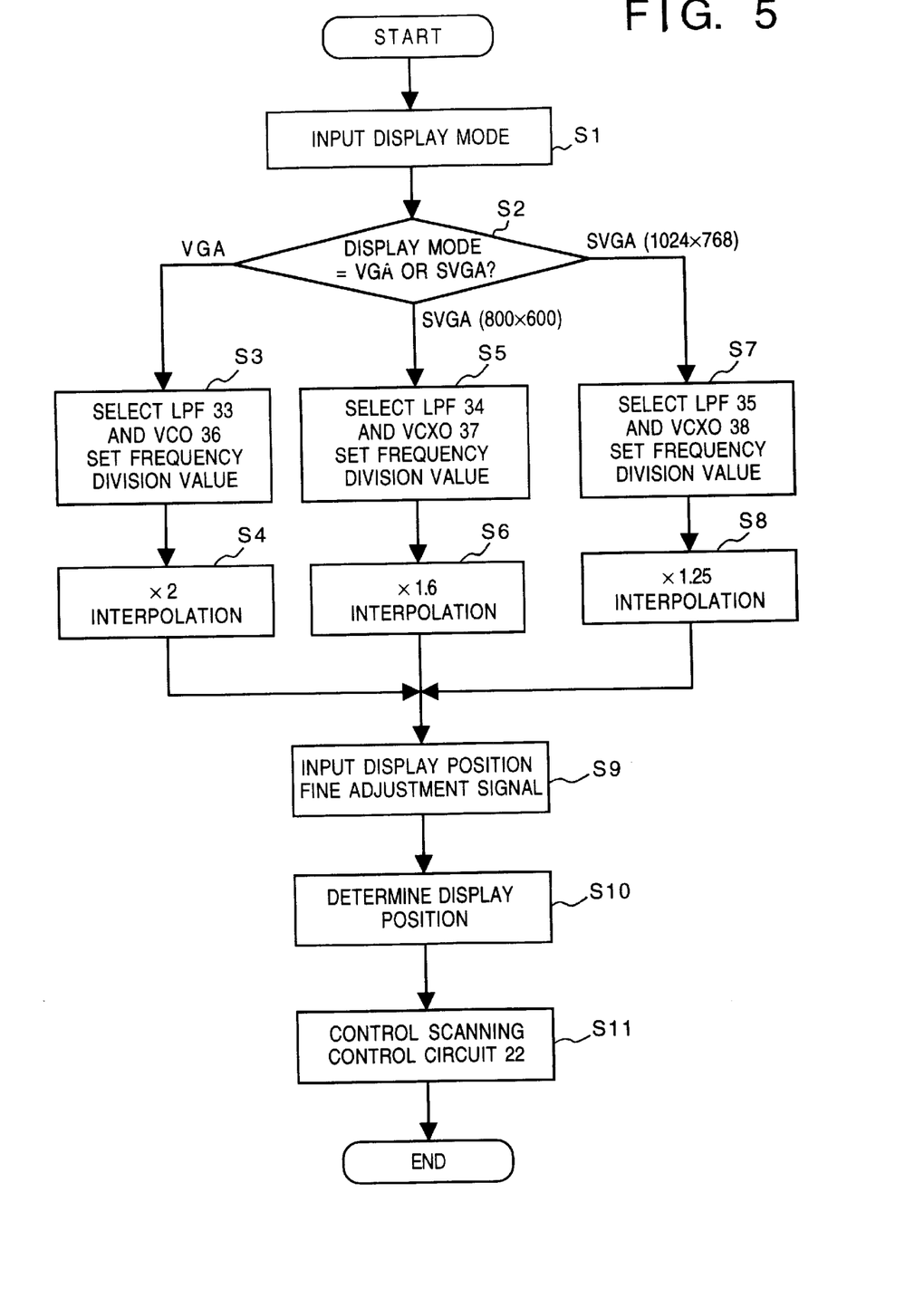
FIG. 5 is a flow chart showing the processing of a display mode dependence controller of the embodiment shown in FIG. 1.

FIG. 5 is a flow chart showing the processing of the display mode dependence controller 17 of this embodiment.

When the controller 17 receives display mode information detected by and output from the display mode detector 15 in step S1, the flow advances to step S2 to discriminate the detected display mode. If the detected display mode is the VGA mode (640×480), the flow advances to step S3, and the controller 17 switches the selection switch 39 to select the LPF 33 and the VCO 36 in the clock generator 14. Then, the controller 17 sets the frequency division value 43 for outputting the dot clock signal 41 of 50 MHz in correspondence with the frequency of 31.5 kHz of the horizontal synchronizing signal in the programmable frequency divider 40. In step S4, the controller 17 instructs the interpolation processing circuit 16 to perform ×2 interpolation.

On the other hand, if the detected display mode is the SVGA mode (800×600), the flow advances to step S5, and the controller 17 switches the selection switch 39 to select the LPF 34 and the VCXO 37 in the clock generator 14. Then, the controller 17 sets the frequency division value 43 for outputting the dot clock signal 41 of 64 MHz in correspondence with the frequency of 37.8 kHz of the horizontal synchronizing signal in the programmable frequency divider 40. In step S6, the controller 17 instructs the interpolation processing circuit 16 to perform ×1.6 interpolation.

Furthermore, if the detected display mode is the SVGA mode (1,024×768), the flow advances to step S7, and the controller 17 switches the selection switch 39 to select the LPF 35 and the VCXO 38 in the clock generator 14. Then, the controller 17 sets the frequency division value 43 for outputting the dot clock signal 41 of 81.3 MHz in correspondence with the frequency of 48.3 kHz of the horizontal synchronizing signal in the programmable frequency divider 40. In step S8, the controller 17 instructs the interpolation processing circuit 16 to perform ×1.25 interpolation.

Upon completion of the data setting operation in the clock generator 14 and the interpolation processing circuit 16, the flow advances to step S9, and the controller 17 receives the display position fine adjustment signal 18 designated by an operator. In step S10, the controller 17 determines the display position in correspondence with the adjustment signal 18. The flow then advances to step S11, and the controller 17 outputs a control signal to the scanning control circuit 22 to display an image at the determined display position on the FLCD panel 24, thereby controlling the display operation. In this flow chart, instruction outputs to the γ characteristic adjustment circuit 19 and the halftone processing circuit 21 are omitted.

The present invention may be applied to either a system constituted by a plurality of devices or an apparatus consisting of a single device. The present invention may also be applied to a case wherein the invention is attained by supplying a program for practicing the present invention to the system or apparatus. In this case, a storage medium which stores the program according to the present invention constitutes the present invention. By loading the program from the storage medium into the system or apparatus, the system or apparatus operates according to the program.

As described above, according to this embodiment, an image input from a personal computer having various display modes such as VGA, SVGA, and the like can be displayed on the display device by a method suitable for the feature of each video signal.

Since a single interface control board can cope with various display modes, a cost reduction of the display device as a whole can be realized.

In this embodiment, the display interface 1 and the display unit 4 are separately arranged. However, the present invention is not limited to this. For example, the present invention may be applied to a display device which integrates the display interface 1 and the display unit 4.

The present invention can be applied to a system constituted by a plurality of devices or to an apparatus comprising a single device.

Furthermore, the invention is applicable also to a case where the invention is embodied by supplying a program to a system or apparatus. In this case, a storage medium, storing a program according to the invention constitutes the invention. The system or apparatus installed with the program read from the medium realizes the functions according to the invention.

The present invention is not limited to the above embodiments and various changes and modifications can be made within the spirit and scope of the present invention. Therefore, to apprise the public of the scope of the invention, the following claims are made.

What is claimed is:

1. A display control apparatus for displaying an image on a display screen by receiving a video signal including an image signal and a synchronizing signal, sampling the video signal in synchronism with a clock signal, and converting the video signal into a digit al signal, said apparatus comprising:

display mode detection mean s for detecting a current display mode on the basis of the synchronizing signal in the video signal;

frequency division means for dividing a frequency of the clock signal by using a frequency division value and for outputting a frequency divided clock signal;

comparison means for comparing the frequency divided clock signal with the synchronizing signal and outputting a difference signal indicating a phase difference between the frequency divided clock signal and the synchronizing signal;

a plurality of low-pass filter means, each of which having a different low-pass frequency from each other, for filtering an inputted signal and outputting a filtered signal;

a plurality of clock generating means, each of which is connected to one of the plurality of low-pass filter means, for generating clock signals having different frequencies from each other;

selection means for selecting one of the clock signals generated by the plurality of clock generating means based on the current display mode detected by said display mode detection means, such that the selected clock signal has a higher frequency than that of the clock signal corresponding to the current display mode when the number of pixels in a horizontal direction in the current display mode is less than the number of pixels in a horizontal direction of the display screen;

sampling means for sampling the video signal in synchronism with a selected clock signal selected by said selection means, such that a resolution of a sampled video signal by said sampling means corresponds to a resolution of the display screen;

converting means for converting the sampled video signal into a digital signal; and output means for outputting a video signal sampled by said sampling means and converted by said converting means to the display.

2. The apparatus according to claim 1, wherein the frequency division value is changed in correspondence with a display position of an image to be displayed on the display.

3. The apparatus according to claim 1, wherein the frequency division value is changed in correspondence with a frequency of the synchronizing signal.

4. The apparatus according to claim 1, wherein each of said plurality of clock generating means comprises a voltage controlled oscillator.

5. The apparatus according to claim 1, wherein the frequency division value is changed in correspondence with the display mode detected by said display mode detection means or a manual operation by an operator.

6. The apparatus according to claim 1, wherein the display mode includes one of a VGA mode and an SVGA mode.

7. The apparatus according to claim 1, further comprising gamma correction means for performing gamma correction of the video signal sampled by said sampling means.

8. The apparatus according to claim 7, further comprising halftone processing means for performing a halftone processing for the video signal gamma-corrected by said gamma correction means.

9. The apparatus according to claim 1, wherein the display is a display using a ferroelectric liquid crystal.

10. The apparatus according to claim 9, further comprising scanning control means for instructing a scanning line to be displayed of the display, and thereafter, outputting a video signal to be displayed on the line to the display.

11. A display device for displaying an image on a display screen by receiving a video signal including an image signal and a synchronization signal, sampling the video signal in synchronism with a clock signal and converting the video signal into a digital signal, said display device comprising:

display mode detection means for detecting a current display mode on the basis of the synchronizing signal in the video signal;

frequency division means for dividing a frequency of the clock signal by using a frequency division value and for outputting a frequency divided clock signal;

comparison means for comparing the frequency divided clock signal with the synchronizing signal and outputting a difference signal indicating a phase difference between the frequency divided clock signal and the synchronizing signal;

a plurality of low-pass filter means, each of which having a different low-pass frequency from each other, for filtering an inputted signal and outputting a filtered signal;

a plurality of clock generating means, each of which is connected to one of the plurality of low-pass filter means, for generating clock signals having different frequencies from each other;

selection means for selecting one of the clock signals generated by the plurality of clock generating means based on the current display mode detected by said display mode detection means, such that the selected clock signal has a higher frequency than that of the clock signal corresponding to the current display mode when the number of pixels in a horizontal direction in the current display mode is less than the number of pixels in a horizontal direction of the display screen;

sampling means for sampling the video signal in synchronism with a selected clock signal selected by said selection means, such that a resolution of a sampled video signal by said sampling means corresponds to a resolution of the display screen;

converting means for converting the sampled video signal into a digital signal; and display means for displaying the video signal sampled by said sampling means and converted by said converting means on the display screen.

12. The device according to claim 11, wherein each of said plurality of clock generating means comprises a voltage controlled oscillator.

13. The device according to claim 11, wherein the frequency division value is changed in correspondence with the display mode detected by said display mode detection means or a manual operation by an operator.

14. The device according to claim 11, wherein the display mode includes one of a VGA mode and an SVGA mode.

15. The device according to claim 11, further comprising gamma correction means for performing gamma correction of the video signal sampled by said sampling means.

16. The device according to claim 15, further comprising halftone processing means for performing halftone processing for the video signal gamma-corrected by said gamma correction means.

17. The device according to claim 11, wherein said display device is a display using a ferroelectric liquid crystal.

18. The device according to claim 17, further comprising scanning control means for instructing a scanning line to be displayed on the screen, and thereafter, outputting a video signal to be displayed on the line to the screen.

19. A display control method for a display device for displaying an image on a display screen by receiving a video signal including an image signal and a synchronizing signal, sampling the video signal in synchronism with a clock signal and converting the video signal into a digital signal, said method comprising the steps of:

detecting a current display mode on the basis of the synchronizing signal in the video signal;

dividing a frequency of the clock signal by using a frequency division value and outputting a frequency divided clock signal;

comparing the frequency divided clock signal with the synchronizing signal and outputting a difference signal indicating a phase difference between the frequency divided clock signal and the synchronizing signal;

inputting the difference signal into a plurality of low-pass filter means and outputting a plurality of filtered signals from the plurality of low-pass filter means, each of which having a different low-pass frequency from each other;

generating clock signals having different frequencies from each other based on the plurality of filtered signals;

selecting one of the clock signals based on the current display mode detected in said detecting step, such that the selected clock signal has a higher frequency than that of the clock signal corresponding to the current display mode when the number of pixels in a horizontal direction in the current display mode is less than the number of pixels in a horizontal direction of the display screen;

sampling the video signal in synchronism with a selected clock signal selected in said selecting step, such that a resolution of a sampled video signal in said sampling step corresponds to a resolution of the display screen;

converting the sampled video signal to a digital signal; and displaying the video signal sampled in said sampling step and converted in said converting step on the display screen.

20. A display control method for displaying an image on a display screen by receiving a video signal including an image signal and a synchronizing signal, sampling the video signal in synchronism with a clock signal, and converting the video signal into a digital signal, said method comprising the steps of:

detecting a current display mode on the basis of horizontal and vertical synchronizing signals in the video signal;

dividing a frequency of the clock signal by using a frequency division value and outputting a frequency divided clock signal;

comparing the frequency divided clock signal with the synchronizing signal and outputting a difference signal indicating a phase difference between the frequency divided clock signal and the synchronizing signal;

inputting the difference signal into a plurality of low-pass filter means and outputting a plurality of filtered signals from the plurality of low-pass filter means, each of which having a different low-pass frequency from each other;

generating clock signals having different frequencies from each other based on the plurality of filtered signals;

selecting one of the clock signals based on the current display mode detected in said detecting step, such that the selected clock signal has a higher frequency than that of the clock signal corresponding to the current display mode when the number of pixels in a horizontal direction in the current display mode is less than the number of pixels in a horizontal direction of the display screen;

sampling the video signal in synchronism with a selected clock signal selected in said selecting step, such that a resolution of a sampled video signal in said sampling step corresponds to a resolution of the display screen;

converting the sampled video signal to a digital signal; and outputting the video signal sampled in said sampling step and converted in said converting step to the display screen.

* * * * *

UNITED STATES PATENT AND TRADEMARK OFFICE
CERTIFICATE OF CORRECTION

PATENT NO. : 6,078,317

DATED : June 20, 2000

INVENTOR(S): MASAYUKI SAWADA

It is certified that error appears in the above-identified patent and that said Letters Patent is hereby corrected as shown below:

COLUMN 7:

Line 43, "digit al signal," should read --digital signal,--.
    Line 45, "mean s" should read --means--.

COLUMN 8:

Line 43, "of" should read --on--.

Signed and Sealed this

Twenty-second Day of May, 2001

Attest:

NICHOLAS P. GODICI

Attesting Officer    Acting Director of the United States Patent and Trademark Office